(12) United States Patent
Reich et al.

(10) Patent No.: US 7,835,566 B2
(45) Date of Patent: Nov. 16, 2010

(54) ALL SURFACE DATA FOR USE IN SUBSTRATE INSPECTION

(75) Inventors: David Reich, Carver, MN (US); Kenneth Durden, Vadnais Heights, MN (US); Randall Shay, Chaska, MN (US)

(73) Assignee: Rudolph Technologies, Inc., Flanders, NJ (US)

( * ) Notice: Subject to any disclaimer, the term of this patent is extended or adjusted under 35 U.S.C. 154(b) by 0 days.

(21) Appl. No.: 12/555,837

(22) Filed: Sep. 9, 2009

(65) Prior Publication Data
US 2010/0067779 A1    Mar. 18, 2010

Related U.S. Application Data

(63) Continuation of application No. 11/296,645, filed on Dec. 7, 2005, now Pat. No. 7,593,565.

(60) Provisional application No. 60/634,159, filed on Dec. 8, 2004.

(51) Int. Cl.
*G06K 9/00* (2006.01)
(52) U.S. Cl. ...................................... 382/145
(58) Field of Classification Search ................. None
See application file for complete search history.

(56) References Cited

U.S. PATENT DOCUMENTS

| 5,617,209 | A | 4/1997 | Svetkoff et al. |
|---|---|---|---|
| 5,692,070 | A | 11/1997 | Kobayashi |
| 5,787,190 | A | 7/1998 | Peng et al. |
| 5,970,166 | A | 10/1999 | Nichani |
| 6,047,083 | A | 4/2000 | Mizuno |
| 6,072,898 | A | 6/2000 | Beaty et al. |
| 6,160,906 | A | 12/2000 | Lehnen et al. |
| 6,493,079 | B1 | 12/2002 | Piacentini |
| 6,525,827 | B2 | 2/2003 | Liu |
| 6,583,414 | B2 | 6/2003 | Nozoe et al. |
| 6,809,809 | B2 | 10/2004 | Kinney et al. |
| 6,870,169 | B2 | 3/2005 | Obara et al. |
| 7,103,505 | B2 | 9/2006 | Teshima et al. |
| 7,106,897 | B1 | 9/2006 | McIntyre et al. |
| 7,171,039 | B2 | 1/2007 | Kondo et al. |
| 7,508,974 | B2 * | 3/2009 | Beaty et al. ................. 382/145 |
| 2002/0034324 | A1 * | 3/2002 | Beaty et al. ................. 382/145 |
| 2002/0037098 | A1 * | 3/2002 | Beaty et al. ................. 382/145 |
| 2005/0038554 | A1 | 2/2005 | Watkins |
| 2005/0100205 | A1 * | 5/2005 | Shishido et al. ............. 382/145 |

OTHER PUBLICATIONS

PCT Search Report mailed Nov. 6, 2007; 13 pages.

* cited by examiner

*Primary Examiner*—Yuzhen Ge
(74) *Attorney, Agent, or Firm*—Dicke, Billig & Czaja, PLLC

(57) ABSTRACT

A system for capturing, calibrating and concatenating all-surface inspection and metrology data is herein disclosed. Uses of such data are also disclosed.

18 Claims, 2 Drawing Sheets

ALL SURFACE DATA FOR USE IN SUBSTRATE INSPECTION

CROSS-REFERENCE TO RELATED APPLICATION

This application is a continuation of Non-Provisional application Ser. No. 11/296,645, filed Dec. 7, 2005, now U.S. Pat. No. 7,593,565, which is related to and claims the benefit of U.S. Provisional Patent Application Ser. No. 60/634,159, filed on Dec. 8, 2004, the teachings of which are incorporated herein by reference. This application is also related to U.S. patent application Ser. No. 10/890,762 filed on Jul. 14, 2004, the teachings of which are incorporated herein by reference.

TECHNICAL FIELD OF THE INVENTION

The present invention relates generally to methods and apparatus for generating and using all surface inspection data in the course of inspecting a semiconductor wafer for defects and in improving the yield of semiconductor fabrication processes.

BACKGROUND OF THE INVENTION

The goal of ever increasing precision and accuracy in the fabrication of semiconductor devices is increasingly important. Improvements in technology continuously shrink the size of semiconductor devices and increase the size of the silicon wafers on which the devices are formed. As a result, semiconductor device fabricators are able to produce more devices per production line and at a greater rate. In this context, ensuring that the percentage of usable semiconductor devices, or yield, remains high is vital as the higher the yield from a given wafer or series of wafers, the more semiconductor devices the manufacturer will have to sell.

One manner of improving yield in the semiconductor manufacturing process involves an inspection process in which a silicon wafer is inspect before and during the fabrication of the semiconductor device, after the semiconductor devices have been formed, and after the semiconductor devices have been separated from one another. Semiconductor devices are also inspected after they are packaged for use in various electronic and electro-mechanical devices.

Inspection of semiconductor devices identifies defects in the semiconductor devices due to errors in the formation of the devices, contamination by particles, and defects in the silicon wafer itself. Once defects have been identified, various yield improvement actions may be taken. In some cases, the defects will be indicative of one or more problems in the fabrication process and corrective measures can be taken. For example, improperly adjusted wafer handling mechanisms may cause scratches in the wafer under certain circumstances. Inspection of the wafer can help identify the mechanism making the scratches so that it can be properly adjusted.

The primary focus of most semiconductor device inspection is on the top surface of a silicon wafer where the dies are located. While the focus of inspection is generally on the top surface of the silicon wafer, it is becoming increasingly important to inspect the edge surface and bottom surface of the wafer. Defects on the top surface of the wafer directly impact the die themselves whereas defects on the edge and bottom surfaces generally impact the die indirectly. For example, blisters or chips on the edge of a silicon wafer can be a source of contamination that can damage or destroy die (the individual devices on the on the top surface of the silicon wafer). Similarly, particles on the back surface of the silicon wafer can cause defects that appear on the front surface of the wafer, e.g. 'hot spots'.

While it is known to inspect the top, edge and back sides of a silicon wafer, this data is typically generated by separate inspection tools, which means that data concerning the distinct top, edge and back sides of the silicon wafer is recorded and analyzed separately. As a consequence, it can be difficult to correlate defects between the respective surfaces of a wafer. Furthermore, it is difficult to simultaneously visualize defect data on the separate top, edge and bottom sides of the silicon wafer when the data cannot be simultaneously viewed.

SUMMARY OF THE INVENTION

A system for capturing, calibrating and concatenating all-surface inspection and metrology data is herein disclosed. Uses of such data are also disclosed.

DETAILED DESCRIPTION OF THE INVENTION

Figure 1:
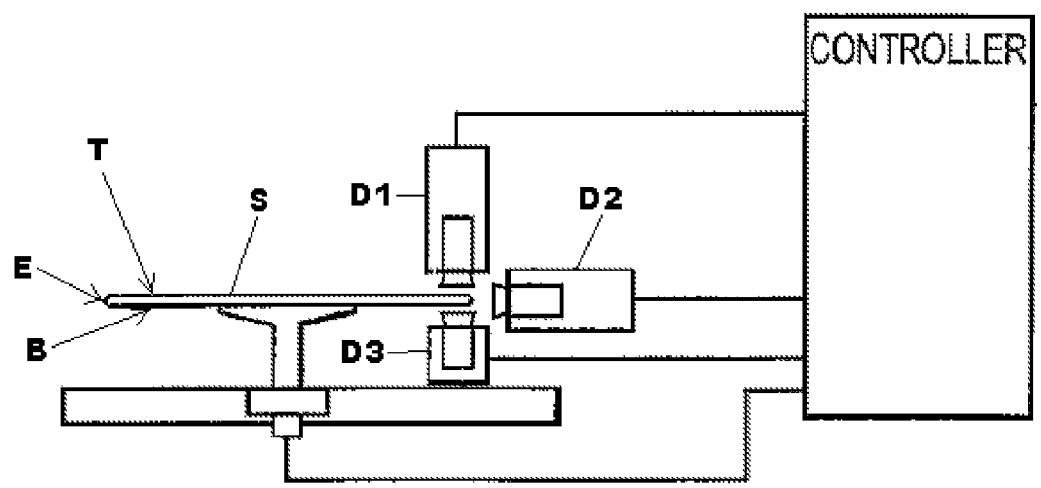
FIG. 1 is a schematic view of an embodiment of an inspection tool capturing all-surface inspection data.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Data Capture

All surface inspection (ASI) data is useful in a number of semiconductor inspection settings. ASI data is, for the purposes of this invention, defined as: metrology data (2D and 3D); defect data; review image data and/or cross-references to review image data; defect classification data; interior crystallographic, geometric and metrology data; deposited layer thickness metrology data; pixel brightness data; pixel color data; die classification data; die identification and location data; die geometry data; and any additional, similar inspection related data concerning two or more distinct surfaces or volumes of at least a portion of a substrate that has been correlated or calibrated such that a single coordinate system positionally relates the data regarding a first surface of the substrate to the data regarding a second surface of the substrate. In some embodiments ASI data is generated regarding substantially all of the substrate including the surface and volume thereof. In other embodiments, ASI data is generated regarding only a portion of the substrate's surfaces and/or volumes. In one embodiment, the substrate may be all or a portion of a semiconductor wafer having one or more semiconductor devices such as, by way of example only, memory chips, computer processors, light emitting diodes, microelectromechanical systems (MEMS) devices and the like formed thereon.

ASI data may be derived from any number of inspection, review or metrology tools or mechanisms including automatic optical inspection (AOI) systems used for imaging and metrology purposes, scanning electron microscopes (SEMS), infrared imaging and metrology systems, ultraviolet (UV) imaging and metrology systems, microwave imaging and metrology systems, laser imaging and metrology systems, ellipsomety systems, laser pulse sonar metrology systems and the like. Depending on how a particular inspection or review tool is constructed and arranged, ASI data regarding a substrate may be captured on a simultaneous basis, on an iterative serial basis, or on a continuous serial basis. In one embodiment, an NSX or AXi automatic optical inspection system from August Technology Corp. of Bloomington, Minn., the owner of the present invention, is in its basic form configured to capture data concerning a top surface of all or a portion of a substrate, in this case a semiconductor wafer. Edge and backside inspection modules configured to work alone or in conjunction with inspection or metrology tools such as the aforementioned NSX and AXi inspection tools capture data concerning the edges and backside of the substrate, respectively. Note that while the aforementioned inspection tools are all from one source and are all automatic optical inspection (AOI) tools, inspection and metrology tools from disparate manufacturers and of disparate types may be used to generate ASI data concerning the respective surfaces of a substrate.

ASI data concerning all or a portion of a substrate may be captured in a continuous or discontinuous manner. For example, in one embodiment, an automated optical inspection tool may serially capture ASI data concerning the top of the substrate, the edge of the substrate, and the bottom of the substrate in a continuous manner in which the tool successively captures data concerning the respective surfaces. In this embodiment, ASI data concerning the respective surfaces and/or volumes of the substrate are preferably captured simultaneously as the respective inspection tools or modules are operated simultaneously to capture ASI data concerning the respective substrates at the same time. In another embodiment, ASI data may be captured continuously and in a simultaneous manner. For example, as can be seen in FIG. 1, information concerning the top surface T of a substrate S, an edge E of a substrate S, and a bottom B of a substrate S may be captured simultaneously by one or more inspection or metrology devices D1, D2, and/or D3. In the embodiment of FIG. 1, the devices D1, D2 and D3 are optical inspection mechanisms but may be any other suitable inspection mechanism in other tools, applications, or embodiments. For example, in other embodiments, different inspection tools such as an SEM and an automated optical inspection system may be used to capture ASI data concerning a single substrate. In this latter embodiment, the capture of ASI data would likely take place in a discontinuous manner as the substrate would have to be transferred between the respective inspection tools for data capture.

Data Structure

In order to facilitate all-surface review of defect, image and metrology data captured from a substrate, it is important to arrange or concatenate this data into a suitable data structure. As used herein, 'data structure' means any electronic structure, device or file type useful for storing and providing information. Further, the term 'concatenate' means the combination, arrangement, linking, cross referencing or hyper-linking of ASI data in such a manner that the ASI data is related by one or common referent. In one embodiment a suitable data structure may comprise a text-based computer file that stores data in a predetermined format or order and which can be written to and read from by an input/output device. Some examples of suitable text based file formats may include comma or tab delimited text files or spreadsheets, HTML files, and XML files. In another embodiment, a data structure may take the form of a single database such as those commercially available under the trade names FrontBase, MySQL, OpenBase, Oracle, PostgreSQL, SQL Server, and Sybase. In yet another embodiment, a suitable data structure may include multiple data files and/or databases distributed across multiple locations on a single computer system or on a network of multiple computers that may be arranged in any useful topology, such as, for example, a line network, a bus network, star network, ring network, mesh network, star-bus network or any combination or variation thereof. In all cases, the data in the one or more files or databases of the data structure are cross-referenced using one or more common referents that allow one or more input/output devices to rapidly write and/or retrieve related defect, image, and metrology data. In one preferred embodiment, a common referent is the three dimensional location or origin of the defect, image or metrology data in question on a substrate. Suitable formats for the location or origin of defect, image or metrology data may include Cartesian, polar, cylindrical, spherical or any other useful coordinate system. Other common referents may be used in addition to or in lieu of the location/origin referents.

Figure 2:
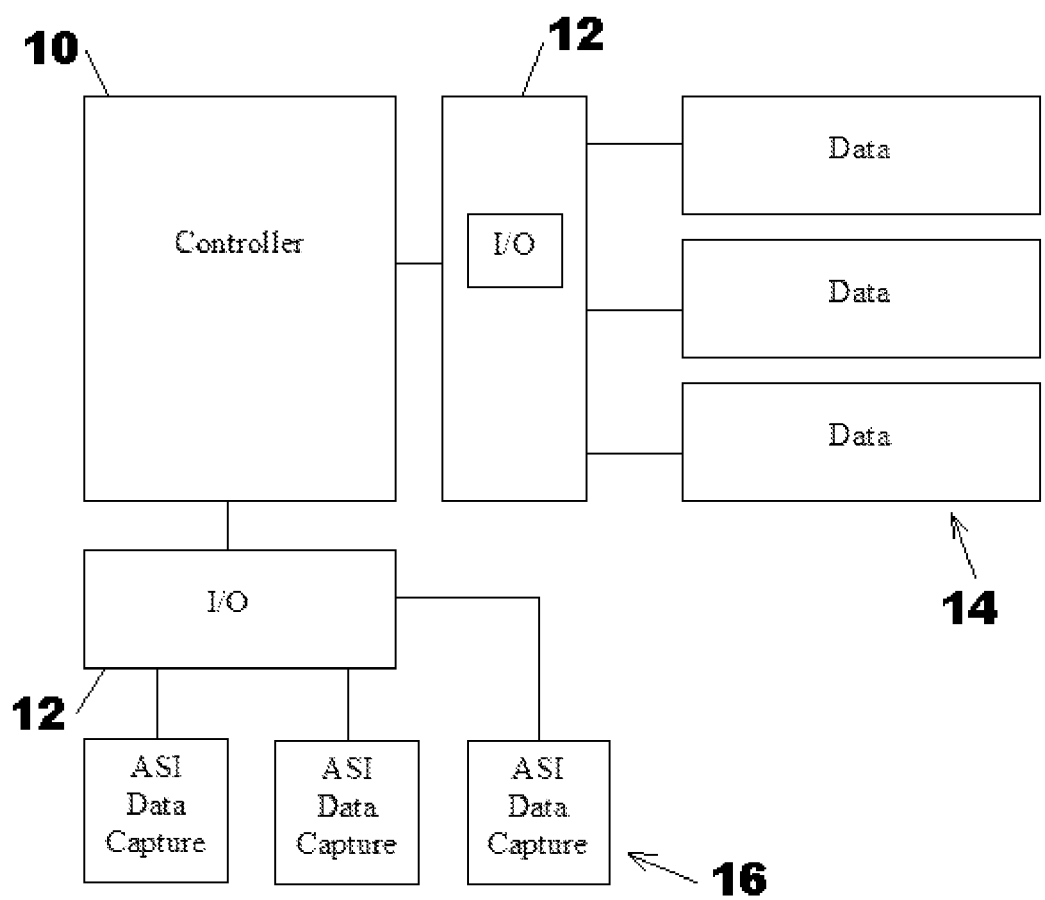
FIG. 2 is a schematic view of an embodiment of a data structure.

One embodiment of a suitable data structure DS for use in storing, providing, and analyzing ASI data is illustrated in FIG. 2. In FIG. 2, a controller 10 that may include one or more central processing units, memory (RAM and/or ROM), and input/output mechanisms is coupled to one or more input/output devices 12 that are used to form a suitable ASI data network. In FIG. 2 the rightmost input/output device 12 couples the controller 10 to one or more data sources 14 that may be files or databases as described above. The lower input/output device 12 is coupled between the controller 10 and one or more data capture devices 16 such as, for example, devices D1, D2 and D3 as illustrated in FIG. 1.

The data structure used to record and provide ASI data is in some embodiments amenable to iterative modification. In some instances ASI data may be used to create a 'golden' reference or model that is used for comparison with later captured images to generate defect data. In such circumstances, multiple sets of ASI data may be combined and/or averaged to create a model against which other ASI data may be measured or compared.

In some other embodiments, the data structure used to record and provide ASI data is adapted to provide for ready expansion and truncation. For example, as a fabrication facility expands its ability to inspect a substrate as by adding more and different types of inspection equipment, the ASI data structure may be expanded to incorporate additional data such as where an AOI tool is added to a front-end semiconductor fabrication process that already includes an ellipsometer. And, as it may be necessary or useful to remove data relating to a particular type of inspection tool, such as where it is found that the defects reported by an SEM are of little or no significance, the ASI data structure allows for the removal of that unneeded data without adversely affecting the remaining data.

In other embodiments, it may be necessary to provide a distributed network that permits the sharing of ASI data concerning one or more substrates between geographically separated locales as where multiple processing steps are performed on substrates in different fabrication facilities. In these applications, ASI data may be generated, calibrated, concatenated and distributed over long distances. In yet other embodiments, ASI data from disparate fabrication facilities may be analyzed for whatever process or yield-related data may be gleaned therefrom. This analysis may take place at a remote, centralized location as where ASI data is transferred to an engineering center for review or in a more distributed manner where an input/output device and associated processor running the required analysis software tools access remote data for processing and/or tabulation/recordation. Accordingly, it is to be understood that ASI data may be useful in managing a fabrication process in purely local, single inspection tool arrangement, on a facility-wide basis that incorporates all of the inspection tools within a given facility, on a multi-facility basis where ASI data is gathered and/or analyzed over a number of facilities that may exist on separate continents, or on some combination thereof.

Calibration

Where positional data is used as a common referent for ASI data, it is useful to calibrate the output of the various inspection tools used to capture the ASI data. In one embodiment, this calibration is carried out using a calibration substrate having known characteristics. Where the substrates to be inspected are semiconductor wafers, a calibration wafer having known registration marks formed on its top, edge and bottom surfaces may be provided. The calibration wafer is inspected using the chosen inspection tools and ASI data concerning the calibration wafer is captured. In one embodiment the calibration wafer may include regularly spaced registration marks, such as alignment fiducials, small lines, or any other useful mark, as well as color patterns and purposefully created particle contamination, chips, cracks, scratches and similar defects. These registration marks and defects are in some embodiments located on substantially the entire surface of the calibration wafer. Note also that the calibration wafer may include volumetric registration marks in some embodiments.

Once ASI data concerning the calibration wafer has been captured, the calibration ASI data concerning the various surfaces is compared and the positional referents are modified by use of known techniques such as linear and rotational transformation such that a common coordinate system applies to the ASI data. Such calibration data is also useful in ensuring that substantially similar inspection tools output substantially the same inspection data, i.e. ASI data obtained from various inspection tools based on an inspection of identical calibration wafers can be used to correlate data output by similar tools so that yield management decisions based on the output of different, but similar, inspection tools can be made in the confidence that what appears to be an issue in the fabrication of a semiconductor device is, in fact, an issue and not an artifact resulting from variances in the output of disparate inspection tools.

Where substrate metrology and alignment data is sufficiently definite concerning a substrate, the use of calibration substrates or wafers may be omitted in favor of using the ASI data, and specifically ASI metrology data, to ensure that the ASI data is correlated with respect to a common positional referent. Where a substrate is a semiconductor wafer, common center-finding and notch/flat location techniques can be used to approximate the calibration data that might gathered using a calibration wafer. Actual wafer thickness derived from wafer edge ASI data may be used to define the distance between top and bottom surfaces. In other cases, a nominal thickness for wafers of the type in question may be used instead. Similarly, actual edge shape and dimension data may be used to calibrate and/or correlate ASI data related to the edge of a wafer to the top and bottom surface. Alternatively, nominal dimension and contour data concerning the size and shape of a wafer edge may be used. As with the use of calibration wafer derived calibration data as described above, the approximated calibration wafer data may be used in conjunction with in known techniques such as linear and rotational transformation to ensure that a common coordinate system or referent applies to the ASI data.

Uses of ASI Data

ASI data is particularly useful in the classification, correlation and review of defects on a substrate. In most defect inspection systems, image comparison algorithms of various types are used to determine differences between reference and actual images. These differences may be noted and saved in the data structure described above using the provided common referents. These differences may or may not be a defect in the sense that the variations represented by the differences may not be an artifact that causes problems for the device being manufactured. Accordingly, aspects of the differences such as size, shape, proximity to other differences and other values are noted and used to determine whether the differences are the type of artifact that negatively affect performance of the device being manufactured, i.e. are actual 'defects'. This process is in some instances manual in that an operator will personally review each of the identified differences and determine whether it is a defect. In some circumstances, a priori rules defined by a user define which differences are defects and that classification is made on an automatic basis. In other cases, statistical analysis of differences identified by inspection tools is used to determine a difference is a defect. Note that in most instances, some combination of these processes is used to determine whether a difference is a defect. Furthermore, most systems 'learn' over time in that as additional data is processed and additional correlations/connections are understood by the system and/or its users, the system may be improved or changed to provide better results.

Having ASI data extends the ability of a user or a defect classification system to correctly classify and correlate defects as additional detail concerning the potential defect is provided. For instance, an artifact on the top surface of a substrate may not, by itself, be classified as a defect. Similarly, an artifact on an edge, bottom or within the substrate may also not be classified as a defect. However, when viewed or analyzed in an all-surface format wherein artifact/defect data may be spatially correlated, the user or automated classification system may be able to more accurately identify the artifact as a defect. Calibrating ASI data and making it available for review through a data structure that includes one or more common referents such as positional data simplifies defect review and classification process by reducing the number of steps needed to determine whether differences/artifacts on distinct surfaces or within the substrate are related to a particular difference/artifact under review. In one embodiment, empirically derived rules based on the size, shape or other characteristics may be used to define a spatial search algorithm that looks for artifacts within a given region or volume of the substrate. Artifacts found within the given region or volume may then be classified as 1) a defect and/or 2) as a defect that is part of or at least related to the defect(s) used to define the spatial search algorithm parameters. The results of this correlation may then be used to determine more information concerning the nature of the defect(s) such as, for example, the origin of the defect.

ASI data may also be used in conjunction with spatial pattern recognition techniques to identify patterns in defects that extend beyond a single surface of a substrate. Analyzing defects on at least portions of two or more surfaces and/or volumes of a substrate such as a semiconductor wafer and even on substantially the entire surface and/or volume of the substrate gives a more complete picture of the success and failure of a fabrication process than does spatial pattern recognition based only on data derived from a single surface of the substrate. In some embodiments therefore, ASI data is used to perform three-dimensional spatial pattern recognition on all artifacts and/or defects found on a substrate. ASI data enhances defect review and classification as well as spatial pattern recognition of larger defects and defect patterns by extending these analyses to all surfaces and even volumes of the substrate.

ASI data may also include inspection, metrology and image data concerning various process layers laid down on a semiconductor wafer substrate during the fabrication of semiconductor devices on the wafer. ASI data may also incorporate fabrication mask data for each of the lithographic layers laid down on the substrate as well as the CAD models used to define and create the lithographic masks themselves. ASI data may be used to analyze the fabrication process by identifying defects and patters of defects related to mask misalignment, damage and de-focus over an entire layer of a wafer substrate, among all layers of a wafer substrate, and among all layers of all wafer substrates being inspected to closely monitor the operation of the lithography tools that handle and utilize the masks. In some embodiments, the impact of a defect in the crystallographic structure of a semiconductor wafer on the various lithographic layers of a semiconductor device can be determined as comprehensive ASI data may include the defect, metrology and image data necessary to correlate a defect that occurs in a first location of a substrate and defects that occur elsewhere in a substrate where the latter defects are spaced apart from the former defect in a three dimensional arrangement. In another embodiment, ASI data is used to correlate defects occurring on the edge of a semiconductor wafer with particles and defects that occur on one or more layers of a patterned semiconductor wafer. This correlation may then be used by a yield management engineer to modify or adjust semiconductor fabrication equipment to reduce the incidence of similar defects in future wafers.

To assist in the visual review of defects on a substrate such as a semiconductor wafer, ASI data may be used to generate a three-dimensional model that may be viewed by a user to gain insight into the nature and source of defects found on the substrate. In one embodiment, calibrated metrology data concerning the size, shape and features of a substrate is used to generate a three dimensional model of the substrate directly, i.e. the resultant three-dimensional model is a substantially exact replica of the actual substrate from which the ASI data has been derived. A substantially exact 3D model such as the aforementioned may be derived using any of a number of known 3D mapping, stitching and/or tessellating techniques. Once the three-dimensional model has been generated, defect and/or image data may be mapped onto the surface of the model to provide additional detail. For example, in one view/embodiment, defect identification codes or coloring show the approximate location of defects on a substrate. In another view/embodiment, the actual images of the defects are mapped onto the surface of the model may be viewed directly. In yet another view/embodiment, a schematic-type defect map may be overlaid in a semi-transparent fashion over the mapped image data on the model so that actual images and the defect map may be viewed simultaneously.

Dynamic panning and zooming may be enabled in some embodiments to provide a user with the ability to see selected portions of the model in greater detail. In one embodiment, image data at varying levels of magnification/resolution is collected to provide the ability to zoom in or out from a selected area of the model. In some embodiments, this zooming feature is a discrete function in that a user may select only the provided magnification/resolution levels. In other embodiments, and where the ASI data is of a suitable granularity, software may be used to either dynamically interpolate data to provide a facsimile representation of the actual image data being viewed. In yet other embodiments, a user may zoom in a feature or portion of a substrate until a resolution threshold is reached; whereafter another image of the same feature or portion at the next finer or coarser resolution (as the case may be) is displayed. Note that in some embodiments, all image data in the ASI data may be kept in close at hand in random access memory. In other embodiments, image data in the ASI data may be loaded or downloaded on the fly as needed. Using the zoom feature in combination with a panning feature and a rotation and flipping feature allows a user to view any aspect or portion of a substrate at a range of useful magnification/resolutions.

In some instances it may be useful to provide the ability for a user to view the multiple lithographic layers on a semiconductor substrate in a semitransparent manner such that the user may see through at least some of the layers to a chosen layer or the substrate. In this way a user can directly visualize how a defect may affect multiple lithographic layers of a semiconductor device. A further useful feature is the ability to render the substrate itself entirely or partially transparent for the purpose of viewing defects in or on the substrate. Yet another feature that may prove useful is the ability to create cross-sectional views of substrates so that a user may directly visualize the characteristics of a defect.

In addition to providing a simple binary defect map, each defect may be provided with an interactive 'flag' icon that shows the location of a defect and gives basic information about the defect, including the defect's basic size, classification, whether it is a 'killer' defect, a tentative or definite indication of what created the defect, and/or links to information about and/or images of similar defects. Additional mapping data may also be generated and included with the ASI data such as die location and orientation maps and indications of which dies have been indicated as being flawed in some way.

In another embodiment a three-dimensional model of a substrate may be created by using a pre-existing model of the substrate and then mapping ASI data onto the pre-existing model. In some embodiments, a 'fit' or calibration map might also be generated and saved as part of the ASI data to indicate areas of the generated or mapped model that are out of specification, i.e. where the images or data do not match up properly.

In yet another embodiment, three dimensional contour data concerning the shape of a substrate may be captured and recorded as part of the ASI data. Where the substrate is an edge-clamped semiconductor wafer, it is sometimes useful to provide a contour map for use in focusing the optics on the wafer. Contour data may be useful in correlating defects with deflection of the wafer.

ASI data may also be used to control one or more inspection or review tools. In viewing a three-dimensional model of a substrate, a user may indicate by selecting a location on the model to which an inspection tool should direct its attention. A user can similarly create a list of such locations to which an inspection tool will successively direct its attention. Furthermore, a user can use the graphical interface represented by a three dimensional model of the types described hereinabove to modify an already-existing inspection recipe. In yet another embodiment, ASI model generated using one type of inspection tool such as an AOI tool, may be used to indicate or modify instructions on the generation and analysis of ASI data by other types of inspection tools, such as, for example, an SEM. Accordingly, where ASI data and the analyses performed thereon indicate that there are defect issues arising from a particular portion of a substrate that is not amenable to inspection by the inspection tool that initially generated ASI data, the user interface represented by the three-dimensional model may be used to route (or create an instruction for a user to move the substrate in the indicated manner) the substrate(s) in question to the required inspection tool (e.g. from an AOI tool to an SEM) and to inspect the indicated areas/volumes of the substrate to generate additional defect, metrology and image data concerning those areas/volumes of interest. Note that this additional data maybe included as an additional part of the ASI data.

In one particular embodiment, ASI data consists of multiple representations of defects found on the various surfaces and/or volumes of a semiconductor wafer. The multiple representations (i.e. defect table, graphical wafer map, image display) allow a user to explore the attributes of a single defect, or groups of defects, to the level they desire. The user can also, in many cases, modify the classification of the defects to change a Pass/Fail disposition of the wafer if deemed necessary upon defect review.

ASI data, including data concerning defects, is in this embodiment collected from disparate inspection stations (top side, edge, and backside) into a single wafer-level defect list. The defects in the list contain both spatial and non-spatial attributes of the defect, such as (but not limited to) wafer coordinates, aspect ratio, color, affected die, classification, etc. Each defect is also associated with the inspection pass which found the defect.

The defect list, along with attributes, is represented in a defect table in a spreadsheet-like format, with columns for attributes and each defect on a single row. The user can limit the defects within the table by choosing which inspection pass(es) for which to display defects. The user can interact with the defect table to select a given defect, which will highlight the defect on the wafer map display and display its associated image(s) if available. The user can also change the classification associated with the defect through the defect table. This change may affect the Pass/Fail disposition of the wafer depending on the criteria defined by the user.

The second representation of the ASI data is the graphical wafer map. This view shows a top view of a wafer, with a die layout superimposed if so defined. The defects are displayed as graphical objects (points, lines, etc.) on the wafer map in accordance with their physical location on the wafer. This will also indicate which die are affected by which defects. The die on the wafer can be color coded to indicate the class of defects contained within the die. As with the defect table, the user can limit the defects displayed on the wafer map by choosing only those defects from inspection passes of interest. By selecting a defect on the wafer map, the associated row in the defect table will be highlighted and any associated image(s) displayed.

Finally, in this embodiment, ASI data provides for the display of any stored image(s) associated with a particular defect. The image display provides a visual representation of the defect itself to aid in further evaluation and potential reclassification of the defect.

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A system of generating inspection data regarding at least a portion of a semiconductor wafer comprising:
   at least one capture device that captures inspection data concerning at least two surfaces of the semiconductor wafer chosen from a top surface, an edge surface and a bottom surface of the semiconductor wafer; and
   a controller coupled to the at least one capture device and calibrates the inspection data concerning the at least two surfaces of the semiconductor wafer such that a single coordinate system may define locations on the at least two surfaces of the semiconductor wafer, forms a three-dimensional model of the wafer based on the capture inspection data, and concatenates the inspection data including the three-dimensional model concerning the at least two surfaces of the semiconductor wafer into a single data structure so that defects occurring on at least two of the surfaces of the semiconductor wafer are correlated to identify semiconductor fabrication process problems.

2. The system of generating inspection data regarding at least a portion of a semiconductor wafer of claim 1,
   wherein the at least one camera is positioned to capture inspection data concerning substantially the entire surface of the semiconductor wafer; and
   wherein the controller is adapted to calibrate the inspection data concerning substantially the entire surface of the semiconductor wafer such that a single coordinate system may define locations on substantially the entire surface of the semiconductor wafer and concatenate the inspection data concerning substantially the entire surface of the semiconductor wafer into a single data structure.

3. The system of generating inspection data regarding at least a portion of a semiconductor wafer of claim 1 wherein the controller is further adapted to use spatial pattern recognition to correlate defects occurring on different surfaces of the semiconductor wafer.

4. The system of generating inspection data regarding at least a portion of a semiconductor wafer of claim 1 wherein inspection data concerning substantially the entire area of each of the at least two surfaces is captured by the at least one capture device.

5. The system of generating inspection data regarding at least a portion of a adapted semiconductor wafer of claim 4 wherein the controller is further identify defects on the at least two surfaces and use spatial pattern recognition to correlate defects occurring on different surfaces of the semiconductor wafer.

6. The system of generating inspection data regarding at least a portion of a semiconductor wafer of claim 1 wherein inspection data concerning only a portion of the entire area of each of the at least two surfaces is captured.

7. The system of generating inspection data regarding at least a portion of a semiconductor wafer of claim 6 wherein the controller is further adapted to identify defects on the portion of the at least two surfaces and use spatial pattern recognition to correlate defects occurring on different surfaces of the semiconductor wafer.

8. The system of generating inspection data regarding at least a portion of a semiconductor wafer of claim 1 wherein the controller is further adapted to generate a three dimensional model of the substrate from the captured inspection data.

9. The system of generating inspection data regarding at least a portion of a semiconductor wafer of claim 1 wherein inspection data comprises data chosen from a list consisting of 2D metrology data, 3D metrology data, defect data, review image data, cross-references to review image data, defect classification data, crystallographic geometric and metrology data, deposited layer thickness metrology data, pixel brightness data, pixel color data, die classification data, die identification and location data, and die geometry data.

10. The system of generating inspection data regarding at least a portion of a semiconductor wafer of claim 1 wherein the data structure comprises data sources chosen from a group consisting of text files, spreadsheets, HTML files, XML files, stand-alone databases and distributed databases.

11. The system of generating inspection data regarding at least a portion of a semiconductor wafer of claim 1 wherein the controller is further adapted to compare the three-dimensional model to a reference so as to identify defects on the semiconductor wafer based on the comparison.

12. The system of generating inspection data regarding at least a portion of a semiconductor wafer of claim 11 wherein the controller is further adapted to modify the reference using the three-dimensional model.

13. A system of generating inspection data regarding at least a portion of a semiconductor wafer comprising:
at least one capture device that captures inspection data at varying levels of resolution concerning at least two surfaces of the semiconductor wafer chosen from a top surface, an edge surface and a bottom surface of the semiconductor wafer;
a controller that calibrates the inspection data concerning the at least two surfaces of the semiconductor wafer such that there exists at least one common referent shared amongst substantially all the inspection data on the at least two surfaces, forms a three-dimensional model of the wafer based on the capture inspection data, concatenates the inspection data including the three-dimensional model concerning the at least two surfaces of the semiconductor wafer into a single data structure, and dynamically interacts with the three-dimensional model to view defect data concerning the wafer at the varying levels of resolution that is stored in the single data structure and which forms part of the three-dimensional model, the defect data including defects occurring on the at least two surfaces.

14. The system of generating inspection data regarding at least a portion of a semiconductor wafer of claim 13 wherein the common referent is positional data.

15. The system of generating inspection data regarding at least a portion of a semiconductor wafer of claim 13 wherein the controller is further adapted to classify defects based on the data stored in the single data structure.

16. The system of generating inspection data regarding at least a portion of a semiconductor wafer of claim 13 further wherein the controller is further adapted to classify data in the single data structure using spatial pattern recognition techniques.

17. The system of generating inspection data regarding at least a portion of a semiconductor wafer of claim 13 wherein the controller is further adapted to control one or more inspection/metrology tool by manipulating data stored in the single data structure.

18. The system of generating inspection data regarding at least a portion of a semiconductor wafer of claim 13 wherein dynamically interacting with the three dimensional model comprises actions chosen from a group consisting of zooming in on the model, panning across the model, rotating the model, flipping the model, and displaying and removing multiple forms of inspection data.

* * * * *

UNITED STATES PATENT AND TRADEMARK OFFICE
CERTIFICATE OF CORRECTION

| | | |
|---|---|---|
| PATENT NO. | : 7,835,566 B2 | Page 1 of 1 |
| APPLICATION NO. | : 12/555837 | |
| DATED | : November 16, 2010 | |
| INVENTOR(S) | : Reich et al. | |

It is certified that error appears in the above-identified patent and that said Letters Patent is hereby corrected as shown below:

Column 3, line 8, delete "ellipsomety" and insert in place thereof --ellipsometry--.

Column 10, line 24, in Claim 1, delete "capture" and insert in place thereof --captured--.

Column 12, line 4, in Claim 13, delete "capture" and insert in place thereof --captured--.

Signed and Sealed this
Third Day of May, 2011

David J. Kappos
*Director of the United States Patent and Trademark Office*